United States Patent
Bennett et al.

(10) Patent No.: US 8,247,709 B2
(45) Date of Patent: Aug. 21, 2012

(54) METHOD OF MAKING A REPLACEABLE KNOCKOUT PART IN A METAL PANEL AND SYSTEMS THEREOF

(75) Inventors: Gregory Mark Bennett, Hillsborough, NC (US); Daniel Paul Kelaher, Holly Springs, NC (US); Timothy Andreas Meserth, Durham, NC (US); Derek Ian Schmidt, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 725 days.

(21) Appl. No.: 12/364,436

(22) Filed: Feb. 2, 2009

(65) Prior Publication Data

US 2010/0193241 A1 Aug. 5, 2010

(51) Int. Cl.
*H02G 3/18* (2006.01)
*H01R 4/00* (2006.01)
*H01R 13/46* (2006.01)
*H05K 9/00* (2006.01)

(52) U.S. Cl. ........ 174/666; 174/650; 174/382; 174/371; 174/58

(58) Field of Classification Search .............. 174/666, 174/650, 382, 371, 58; 362/285–288, 147, 362/432
See application file for complete search history.

(56) References Cited

U.S. PATENT DOCUMENTS

| | | | | |
|---|---|---|---|---|
| 2,297,862 A * | 10/1942 | Bachmann | ...................... | 220/3.6 |
| 4,057,164 A * | 11/1977 | Maier | ............................ | 220/3.6 |
| 4,825,339 A * | 4/1989 | Boudon et al. | ................ | 361/724 |
| 6,178,097 B1 | 1/2001 | Hauk, Jr. | ........................ | 361/816 |
| 6,897,371 B1 | 5/2005 | Kurz et al. | ...................... | 174/35 |
| 7,110,253 B2 | 9/2006 | Fan | ................ | 361/686 |
| 7,119,286 B1 | 10/2006 | Horng | ........................... | 174/379 |
| 7,133,290 B2 | 11/2006 | Junkins et al. | ................ | 361/726 |
| 7,147,812 B2 | 12/2006 | Hammon | ...................... | 264/135 |
| 7,291,792 B2 | 11/2007 | Chang | ........................... | 174/382 |
| 7,812,255 B2 * | 10/2010 | Garvin | ........................... | 174/50 |
| 2002/0139552 A1* | 10/2002 | Chang | ........................... | 174/35 R |
| 2002/0153155 A1* | 10/2002 | Weiblen | ........................... | 174/52.3 |
| 2006/0005987 A1* | 1/2006 | Denier et al. | ................... | 174/58 |
| 2006/0109618 A1* | 5/2006 | Junkins et al. | ................ | 361/683 |
| 2006/0170129 A1* | 8/2006 | Hammon | ...................... | 264/135 |

* cited by examiner

*Primary Examiner* — Quyen Leung
*Assistant Examiner* — Terrance Kenerly
(74) *Attorney, Agent, or Firm* — Zilka-Kotab, PC

(57) ABSTRACT

A product according to one embodiment includes a metal panel having a main portion and a knockout portion formed therein, the knockout portion being coupled to the main portion by at least one web of metal contiguous to both the knockout portion and the main portion, the at least one web allowing detachment of the knockout portion from the main portion, wherein the knockout portion includes at least one member insertable in one or more apertures in the main portion for allowing re-coupling the knockout portion to the main portion after detachment therefrom.

20 Claims, 5 Drawing Sheets

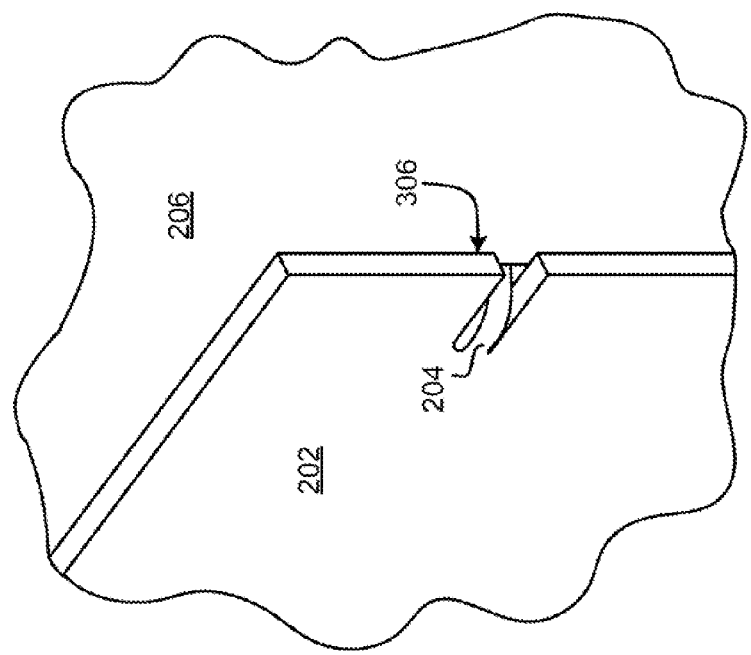
FIG. 3C
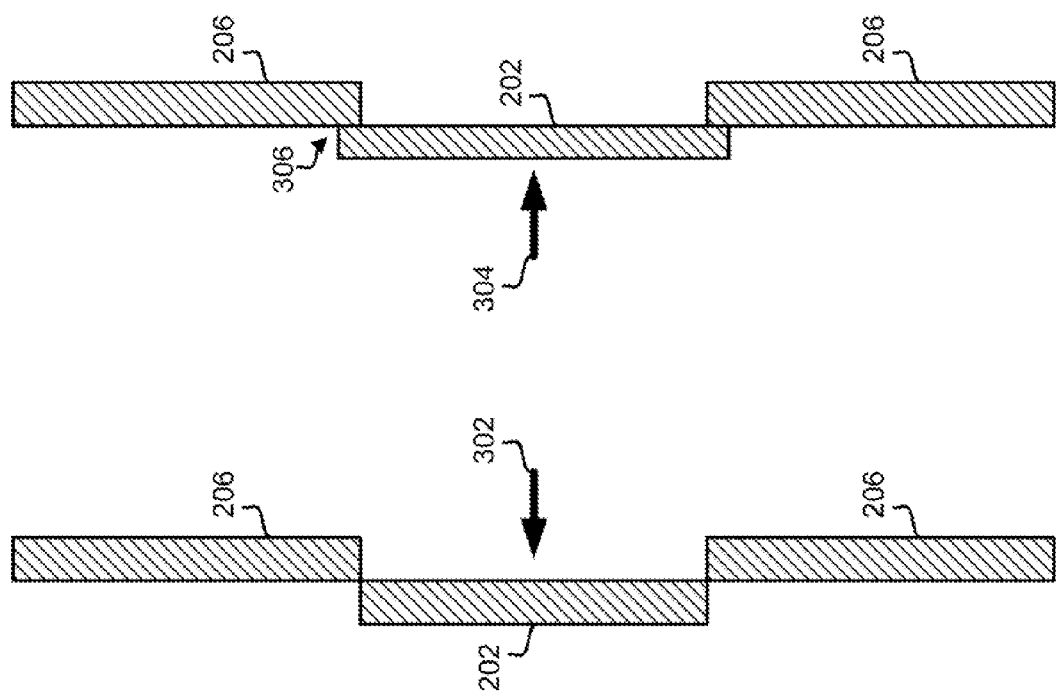
FIG. 3B
FIG. 3A

METHOD OF MAKING A REPLACEABLE KNOCKOUT PART IN A METAL PANEL AND SYSTEMS THEREOF

BACKGROUND

The present invention relates to metal panels and enclosures, and more particularly, this invention relates to creating a replaceable knockout part in a metal panel.

Many electronic system chasses are enabled for numerous configurations. For example, one configuration of a system may have only 1 cable exiting the main chassis enclosure while another configuration may have 2 or more cables exiting the chassis. Also, sometimes an electronic chassis is designed to accommodate more than one type of electronics equipment, such as a computer chassis which is able to accept any of various motherboards and other system components which are designed according to dimensional criteria so that they will fit into standard housings. Furthermore, some components of electronics equipment require access to a portion of the component, such as a video monitor adaptor, which typically will have a video monitor adaptor which is accessible from the exterior of the housing. Each component of this type may have different size requirement for the exterior access.

One method of accommodating a variety of cables or other optional parts from exiting an enclosure is to have removable panels that are fastened onto the main enclosure. However, the number of fasteners that may exist on an enclosure can be large and time consuming to install from a manufacturing standpoint. Therefore, a more cost effective method and system of allowing for removable panels from a main enclosure would be beneficial from a manufacturing standpoint.

As shown in FIG. 1, a cheaper alternative currently being used is a "knockout" panel 102. The knockout panel 102 is held in place to the enclosure 106 with just 2-4 small contact points 104 of metal so that the panel 102 can be easily removed from the main enclosure 106, such as by being twisted back and forth such that the small metal webs 104 connecting the panel 102 to the main enclosure 106 are broken, and the knockout panel 102 can be separated from the rest of the enclosure 106.

However, the disadvantage of this feature is that the knockout panel is permanently removed from the main enclosure once those small metal webs have been broken. Therefore, a solution which can be replaced, but is also cost effective and does not require extra manufacturing assembly time and additional parts cost would be very beneficial.

SUMMARY

A product according to one embodiment includes a metal panel having a main portion and a knockout portion formed therein, the knockout portion being coupled to the main portion by at least one web of metal contiguous to both the knockout portion and the main portion, the at least one web allowing detachment of the knockout portion from the main portion, wherein the knockout portion includes at least one member insertable in one or more apertures in the main portion for allowing re-coupling the knockout portion to the main portion after detachment there from.

According to another embodiment, a product includes a metal panel having a main portion and a knockout portion formed therein, the knockout portion being coupled to the main portion by at least one web of metal contiguous to both the knockout portion and the main portion, the at least one web allowing detachment of the knockout portion from the main portion, wherein the main portion includes at least one member insertable in one or more apertures in the knockout portion for allowing re-coupling the knockout portion to the main portion after detachment therefrom.

A method, according to yet another embodiment, includes stamping a metal panel for forming a knockout portion, thereby defining a main portion at least partially surrounding the knockout portion, the knockout portion being coupled to the main portion by at least one web of metal contiguous to both the knockout portion and the main, portion, the at least one web allowing detachment of the knockout portion from the main portion. Also, according to this embodiment, the method includes forming an aperture in at least one of the knockout portion and the main portion, wherein at least one of the knockout portion and the main portion have a member insertable in the aperture for re-coupling the knockout portion to the main portion after detachment therefrom.

In another embodiment, a method includes breaking a web coupling a knockout portion of a metal panel to a main portion of the metal panel for detaching the knockout portion from the main portion, the web being contiguous to both the knockout portion and the main portion. Also, this method includes re-coupling the knockout portion to the main portion by causing insertion of a member extending from the knockout portion or main portion into an aperture in the other portion.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 3A is a cross sectional side view of a panel after a stamping process according to one embodiment.

FIG. 3B is a cross sectional side view of a panel after another stamping process according to one embodiment.

FIG. 3C is an isometric view of a portion of a knockout panel and main panel showing a metal web according to one embodiment.

DETAILED DESCRIPTION

Figure 1:
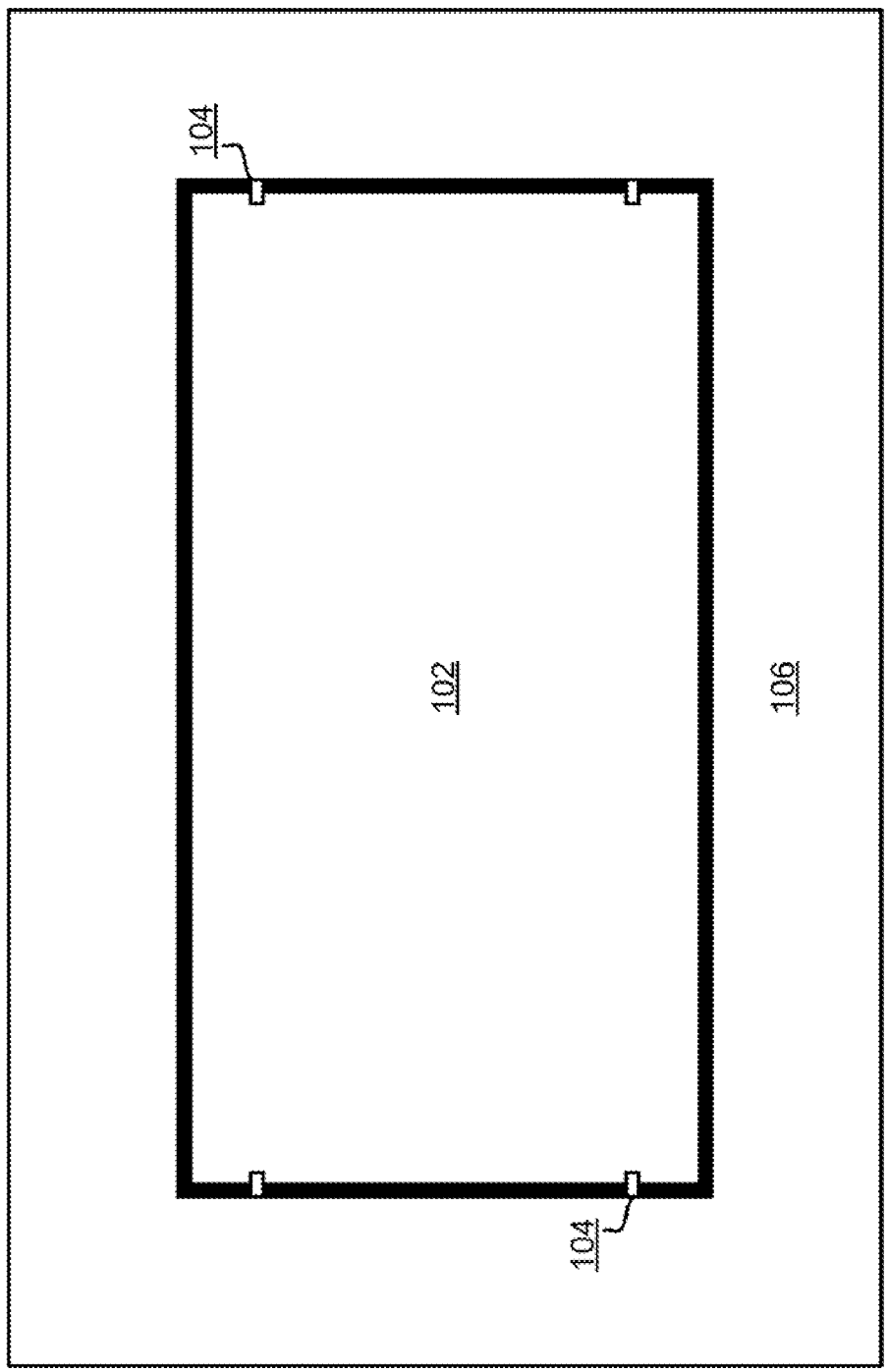
FIG. 1 is a simplified drawing of a typical knockout panel.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of knockout panels for electronics chasses, as well as fabrication, operation and/or component parts thereof.

In one general embodiment, a product includes a metal panel having a main portion and a knockout portion formed therein, the knockout portion being coupled to the main portion by at least one web of metal contiguous to both the knockout portion and the main portion, the at least one web allowing detachment of the knockout portion from the main portion, wherein the knockout portion includes at least one member insertable in one or more apertures in the main portion for allowing re-coupling the knockout portion to the main portion after detachment therefrom.

In another general embodiment, a product includes a metal panel having a main portion and a knockout portion formed therein, the knockout portion being coupled to the main portion by at least one web of metal contiguous to both the knockout portion and the main portion, the at least one web allowing detachment of the knockout portion from the main portion, wherein the main portion includes at least one member insertable in one or more apertures in the knockout portion for allowing re-coupling the knockout portion to the main portion after detachment therefrom.

In another general embodiment, a method includes stamping a metal panel for forming a knockout portion, thereby defining a main portion at least partially surrounding the knockout portion, the knockout portion being coupled to the main portion by at least one web of metal contiguous to both the knockout portion and the main portion, the at least one web allowing detachment of the knockout portion from the main portion; and forming an aperture in at least one of the knockout portion and the main portion, wherein at least one of the knockout portion and the main portion have a member insertable in the aperture for re-coupling the knockout portion to the main portion after detachment therefrom.

In another general embodiment, a method includes breaking a web coupling a knockout portion of a metal panel to a main portion of the metal panel for detaching the knockout portion from the main portion, the web being contiguous to both the knockout portion and the main portion; and re-coupling the knockout portion to the main portion by causing insertion of a member extending from the knockout portion or main portion into an aperture in the other portion.

To address the issues associated with current knockout panels, several methods have been developed according to various embodiments of the present invention. One of these methods includes a knockout feature that can be rotated after it has been removed from the main panel and has snap-in features built into the knockout panel such that it can be replaced back into the main enclosure, according to one embodiment. Some advantages that this embodiment has over current knockout panels are that this replaceable knockout feature does not cost more because of additional fasteners and there are no extra part costs because the panel can be constructed of the same material which comprises the main panel. Additionally, this embodiment can prevent electromagnetic interference (EMI) leakages from the system via an additional step in the tooling process which does not incur any extra part cost. This method can be applied to a variety of different knockout shapes, including circular, rectangular, trapezoidal, etc.

Figure 2:
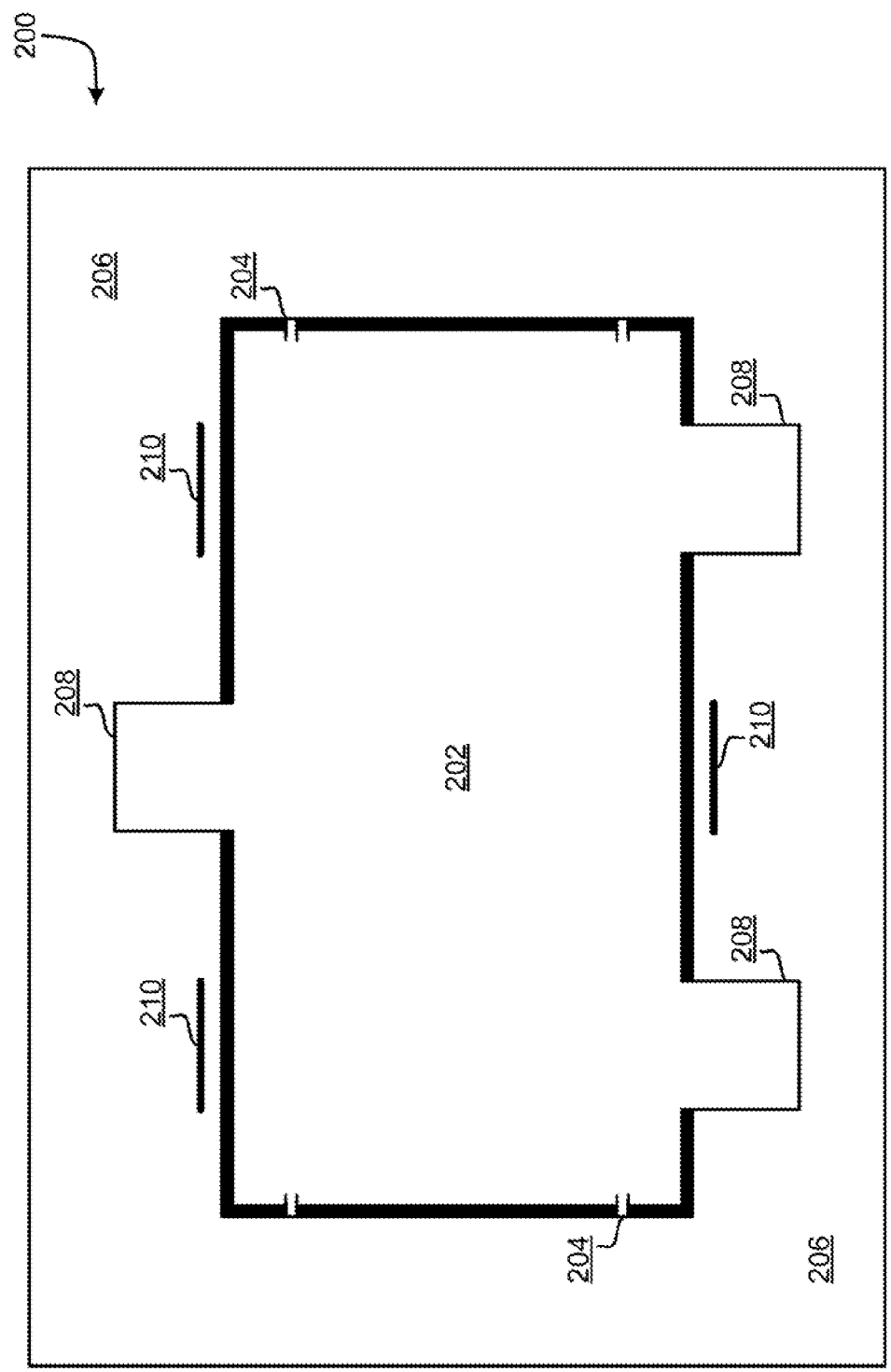
FIG. 2 is a simplified drawing of a knockout panel according to one embodiment.

FIG. 2 shows an illustrative knockout panel 202 in a main panel 206 according to one embodiment. Of course, the knockout panel 202 may have any shape that could be used along with this invention, such as circular, elliptical, trapezoidal, etc. The apertures 210 and the knockout panel 202 may be formed from the main panel 206 at the same time, during the same process, or may be formed in separate processes.

According to this embodiment, apertures 210, such as slots, holes, etc., may be punched into the main panel 206 around the knockout panel 202 while also punching out sections of the main panel 206 which may be used as members 208 on the removable knockout panel 202. In FIG. 2, the main panel 206 of a metal chassis 200 housing is shown after the knockout panel 202 has been punched out, such as by a metal forming tool. The replaceable knockout panel 202 may be retained to the main panel 206 with several small webs 204 of metal while the rest of the knockout panel 202 may be separated from the main panel 206. This allows the knockout panel 202 to remain attached to the main panel 206 until removal is desired. Members 208 with retaining features such as dimples may be formed out of the longer extensions cut into the main panel 206. These members 208 may be bent into the chassis 200 at approximately right angles with the main panel 206. These members 208 may be used later to retain the knockout panel 202 against the main panel 206 when it is replaced.

Using a shearing process to make the main separations between the knockout panel 202 and the main panel 206 allows the width of the knockout panel 202 to be as wide as the opening in the main panel 206 from which it was cut. An optional tooling step may compress the replaceable knockout panel 202 such that the thickness of the metal is actually reduced, and the edges of the metal may be spread out across its height and width, just like a balloon bulges outward on the sides when it is compressed in one axis. This extra material "stretching" that occurs on the outer edges of the knockout panel 202 may actually overlap the edges of the cutout in the main panel 206 around the circumference of the main panel's cutout. This continuous metal contact will reduce the chances that Electromagnetic Interference (EMI) will be allowed to escape from the gaps between the replaced knockout panel 202 and the main panel 206.

Now referring to FIGS. 3A and 3B, cross-sectional side views of material comprising a knockout panel 202 and main panel 206 are shown according to two embodiments.

In FIG. 3A, a knockout panel 202 is shown after a first stamping process 302 has been performed, where the knockout panel 202 is sheared from the main panel 206 except for the small metal webs (not shown) which are still connected to the main panel 206.

In FIG. 3B, a knockout panel 202 is shown after a second stamping process 304 where the knockout panel 202 is thinned and stretched, thus providing for overlap 306 of the knockout panel 202 over the main panel 206. The overlap section is critical to reducing EMI from leaving the enclosure.

Now referring to FIG. 3C, a partial isometric view is shown of a metal web 204 and overlap 306 according to one embodiment. As can be seen, the knockout panel 202 is wider than the gap in the main panel 206 after the stamping process shown in FIG. 3E, thus causing overlap 306. In addition, the metal web 204 continues to be in contact with and connected to the main panel 206, which enables the knockout panel 202 to remain coupled with the main panel 206 until removal is desired, which can be accomplished by twisting or otherwise breaking the metal webs 204.

With reference to FIGS. 2, 3A-3C, a method may be described according to one embodiment. This method may be used in conjunction with components and descriptions for FIGS. 2-4, but may also be used in any desired environment. The figures. are used merely to describe the method, and are not meant to be limiting in any manner.

In one embodiment, a method may include stamping a metal panel 208 for forming a knockout portion 202, thereby defining a main portion 206 at least partially surrounding the knockout portion 202, the knockout portion 202 being coupled to the main portion 206 by at least one web 204 of metal contiguous to both the knockout portion 202 and the main portion 202, the at least one web 204 allowing detachment of the knockout portion 202 from the main portion 202. In addition, this method may include forming an aperture 210 in at least one of the knockout portion 202 and the main portion 206, wherein at least one of the knockout portion 202 and the main portion 206 have a member 208 insertable in the aperture 210 for re-coupling the knockout portion 202 to the main portion 206 after detachment therefrom. Note that in the various embodiments of the present invention, the use of "at least one" and nonuse thereof should not be construed as limiting in any manner. Rather, as noted above, singular usages are meant to include the plural referents unless specifically defined otherwise by qualifying terminology such as "only one", "a single", etc. Accordingly, for example, the member 208 described in this paragraph includes one member, at least one member, a plurality of members, etc., which can be on the knockout portion 202, the main portion 206, or both.

For example, in FIG. 2, the knockout portion 202 has members 208 that can be bent forward toward the main panel 206 after removal therefrom. The knockout panel 202 may then be rotated 180°, and re-coupled with the main portion 206 by inserting the members 208 into the apertures 218.

In some embodiments of the method, the member 208 may be formed by the stamping. This would allow for the method to have fewer steps, and therefore be more efficient in terms of cost and time.

In another embodiment of the method, the member 208 may include a protrusion for creating a mechanical coupling with the main portion 206. This protrusion may include dimples, a bent portion, a larger portion, etc. For example, the member 208 shown in FIG. 2 may be bent inward toward the center of the knockout panel 202, thereby creating tension in the apertures 210 once the knockout panel 202 is re-coupled to the main portion 206.

In some more embodiments of the method, the member 208 may be oriented at an angle of between 0° and 180° relative to a plane of the knockout portion 202. For example, the member 208 may be bent toward the main portion 206 prior to re-coupling. Also, the aperture 210 in the main portion 206 may be positioned to permit the knockout portion 202, when re-coupled to the main portion 206 after detachment therefrom, to at least substantially cover a hole created by its detachment. For example, when the knockout portion 202 is stamped from the panel 200, the panel 200 will have a hole in the shape of the knockout portion 202 left when the knockout portion 202 is removed. This hole may be substantially covered by the knockout portion 202 upon re-coupling with the main portion 206.

In some approaches, the method may further comprise causing at least one edge of the knockout portion 202 to overlap an edge of the main portion 206 adjacent thereto. For example, with reference to FIG. 3B, this overlap 306 may be around one, some, or all edges of the knockout portion 202 in relation to the main portion 206. In addition, this overlap 306 may be caused by a stamping process, whereby at least one edge of the knockout portion 202 maybe caused to overlap the edge of the main portion 206 adjacent thereto by compressing the knockout portion 202 for expanding an outer periphery thereof.

In more approaches, the knockout portion 202 may be rotated from its original position when re-coupled to the main portion 206, such as by 30°, 60°, 90°, 180°, etc. This rotation may allow members to align with apertures, and/or may allow the knockout portion 202 to substantially cover the hole. In addition, the knockout portion 202 may be flipped before re-coupling with the main portion 206.

According to some approaches, the aperture 210 may be positioned to permit the knockout portion 202, when re-coupled to the main portion 206 after detachment, to at least substantially cover a hole created by its detachment.

According to another embodiment, a method may include breaking a web 204 coupling a knockout portion 202 of a metal panel 200 to a main portion 206 of the metal panel 200 for detaching the knockout portion 202 from the main portion 206, the web 204 being contiguous to both the knockout portion 202 and the main portion 206. In addition, the method may include re-coupling the knockout portion 202 to the main portion 206 by causing insertion of a member 208 extending from the knockout portion 202 or main portion 206 into an aperture 210 in the other portion. This method allows for re-coupling of the knockout portion 202 to the main portion 206.

In some embodiment of this method, the knockout portion 202 may be rotated from its original position when re-coupled to the main portion 206. In addition, the member 208 may include a protrusion for creating a mechanical coupling with the main portion 206, as described previously.

Figure 4:
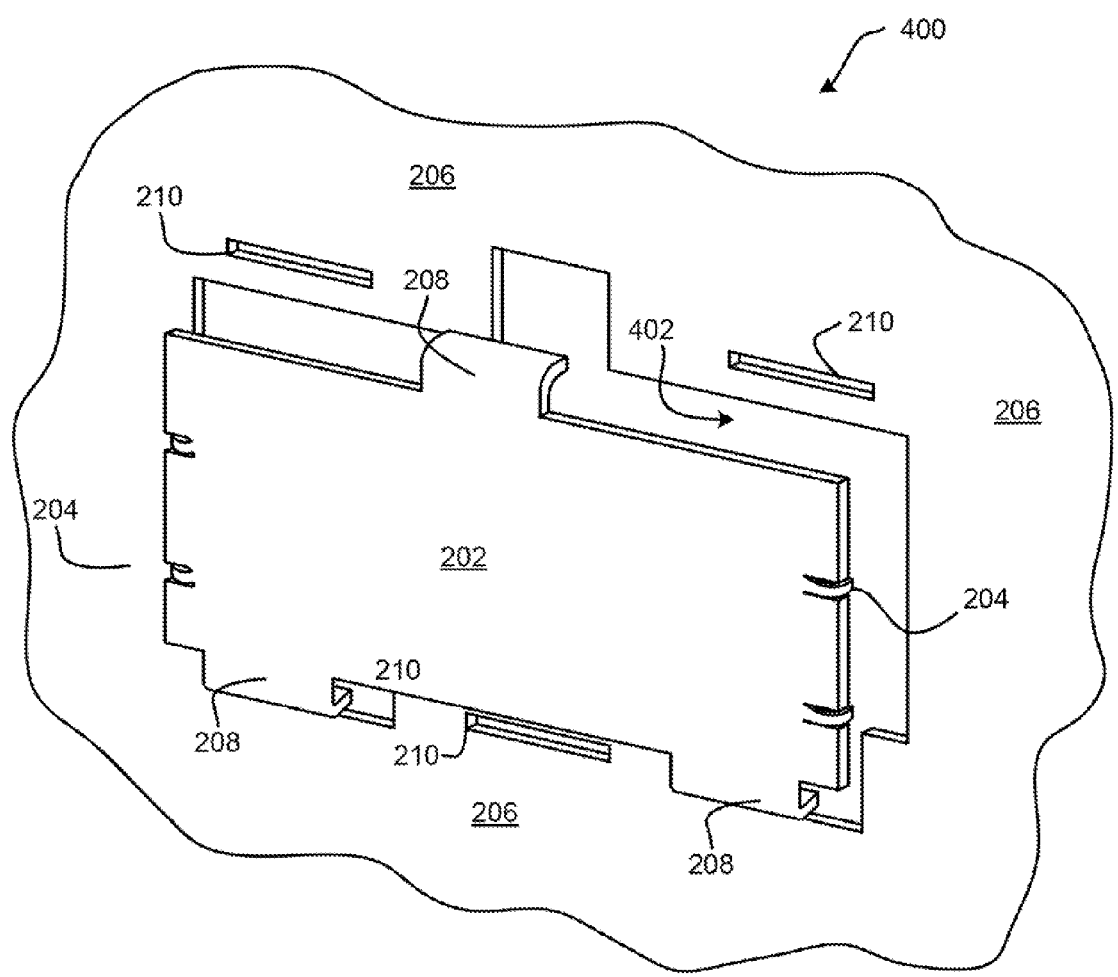
FIG. 4 is an isometric view of a knockout panel and portions of a main panel according to one embodiment.

With reference to FIG. 4, an isometric view of a knockout panel 202 with tabs 208 bent. In one embodiment, a product may comprise a metal panel 400 having a main portion 206 and a knockout portion 202 formed therein. The knockout portion 202 may be coupled to the main portion 206 by at least one web 204 of metal contiguous to both the knockout portion 202 and the main portion 206, the at least one web 204 allowing detachment of the knockout portion 202 from the main portion 206.

Figure 5:
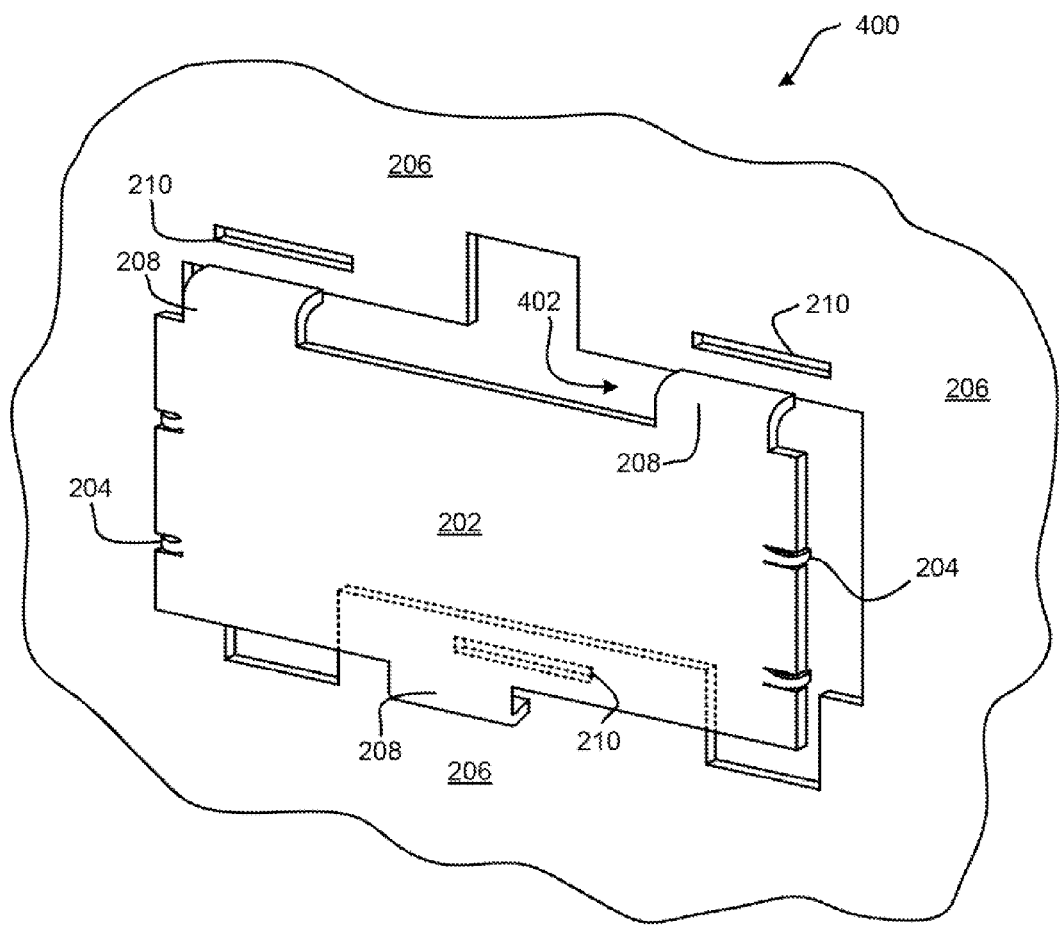
FIG. 5 is an isometric view of a knockout panel and portions of a main panel aligned for re-coupling according to one embodiment.

In addition, the knockout portion 202 may include at least one member (such as a tab) 208 that is insertable in one or more apertures (such as slots) 210 in the main portion 206 for allowing re-coupling of the knockout portion 202 to the main portion 206 after detachment therefrom. For example, FIG. 5 shows the knockout portion 202 aligned to be reengaged to the main portion 206 according to one embodiment. In this embodiment, the knockout portion 202 has been rotated 180° allowing the members 208 to line up with the apertures 210, such that they may be engaged and the knockout portion 202 may be re-coupled to the main portion 206.

In some embodiments, the at least one tab 208 may include a protrusion for creating a mechanical coupling with the main portion 206. For example, there may be dimples, a ledge, a bent portion, etc., on the tab 208 which may cause tension when the tab 208 is engaged with the main portion 206, thus causing a mechanical coupling. In addition, all tabs 208 or fewer than all tabs 208 may have this additional protrusion.

In more embodiments, the at least one tab 208 may be oriented at an angle of between 0° and 180° relative to a plane of the knockout portion, preferably between about 45° and about 135°, more preferably between about 80° and 100°.

According to some embodiments, the one or more slots 210 in the main portion 206 may be positioned to permit the knockout portion 202, when re-coupled to the main portion 206 after detachment therefrom, to at least substantially cover a hole 402 created by its detachment, e.g., substantially covering being greater than about 50% coverage as viewed from directly overhead in a direction perpendicular to the plane of the main portion 206, preferably greater than about 75%, more preferably greater than about 90%. As used herein, the plane may denote an overall or normalized plane of the feature (e.g., as where the panel is curved, the overall plane thereof may extend tangentially to the curved outer surface, across the outer edges of the feature, through points that are equidistant from corners of the feature, etc.), and/or a plane extending along a planar portion of the feature.

In some approaches, at least one edge of the knockout portion 202 overlaps an edge of the main portion 206 adjacent thereto. This may be referred to as overlap (306, FIG. 3C) as described above. In some more approaches, multiple edges of the knockout portion 202 may overlap edges of the main portion 206 adjacent thereto.

In a particularly preferred approach, the knockout portion 202 may be rotated from its original position when re-coupled to the main portion 206. For example, the knockout portion 202 shown in FIG. 4 may be rotated 180° and then reengaged with the main portion 206, as shown in FIG. 5, by aligning the tabs 208 with the slots 210. In other embodiments, the knockout portion 202 could be shifted over, though in this approach, the knockout portion 202 is not likely then to cover nearly all of the hole 402. Also, the knockout portion may be rotated more or less than 180° and then reengaged with the main portion, such as 90°, 60°, etc.

It will be clear that the various features of the foregoing methodologies may be combined in any way, creating a plurality of combinations from the descriptions presented above.

It will also be clear to one skilled in the art that the methodology of the present invention may suitably be embodied in a logic apparatus comprising logic to perform various steps of the methodology presented herein, and that such logic may comprise hardware components or firmware components.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
   a metal panel having a main portion and a knockout portion formed therein,
   the knockout portion being coupled to the main portion by at least one web of metal contiguous to both the knockout portion and the main portion, the at least one web allowing detachment of the knockout portion from the main portion,
   wherein the knockout portion includes at least one member insertable in one or more apertures in the main portion for allowing re-coupling the knockout portion to the main portion after detachment therefrom.

2. The product of claim 1, wherein the at least one member includes a protrusion for creating a mechanical coupling with the main portion.

3. The product of claim 1, wherein the at least one member is oriented at an angle of between 0° and 180° relative to a plane of the knockout portion.

4. The product of claim 1, wherein the one or more apertures in the main portion is positioned to permit the knockout portion, when re-coupled to the main portion after detachment therefrom, to at least substantially cover a hole created by its detachment.

5. The product of claim 1, wherein at least one edge of the knockout portion overlaps an edge of the main portion adjacent thereto.

6. The product of claim 1, wherein multiple edges of the knockout portion overlap edges of the main portion adjacent thereto.

7. The product of claim 1, wherein the at least one web of contiguous metal is broken when the knockout portion is detached from the main portion, and wherein the knockout portion is rotated from its original position when re-coupled to the main portion.

8. A method for forming the product as recited in claim 1, comprising:
   stamping a metal panel for forming the knockout portion, thereby defining the main portion at least partially surrounding the knockout portion, the knockout portion being coupled to the main portion by the at least one web of metal contiguous to both the knockout portion and the main portion, the at least one web allowing detachment of the knockout portion from the main portion; and
   forming an aperture in at least one of the knockout portion and the main portion,
   wherein at least one of the knockout portion and the main portion have a member insertable in the aperture for re-coupling the knockout portion to the main portion after detachment therefrom.

9. The method of claim 8, wherein the member is formed by the stamping.

10. The method of claim 8, wherein the member includes a protrusion for creating a mechanical coupling with the main portion.

11. The method of claim 8, wherein the member is oriented at an angle of between 0° and 180° relative to a plane of the knockout portion.

12. The method of claim 8, wherein the aperture in the main portion is positioned to permit the knockout portion, when re-coupled to the main portion after detachment therefrom, to at least substantially cover a hole created by its detachment.

13. The method of claim 8, further comprising causing at least one edge of the knockout portion to overlap an edge of the main portion adjacent thereto.

14. The method of claim 13, wherein the at least one edge of the knockout portion is caused to overlap the edge of the main portion adjacent thereto by compressing the knockout portion for expanding an outer periphery thereof.

15. The method of claim 8, wherein the knockout portion is rotated from its original position when re-coupled to the main portion.

16. The method of claim 8, wherein the aperture is positioned to permit the knockout portion, when re-coupled to the main portion after detachment, to at least substantially cover a hole created by its detachment.

17. A product, comprising:
   a metal panel having a main portion and a knockout portion formed therein,
   the knockout portion being coupled to the main portion by at least one web of metal contiguous to both the knockout portion and the main portion, the at least one web allowing detachment of the knockout portion from the main portion,
   wherein the main portion includes at least one member insertable in one or more apertures in the knockout portion for allowing re-coupling the knockout portion to the main portion after detachment therefrom.

18. A method, comprising:
   breaking a web coupling a knockout portion of a metal panel to a main portion of the metal panel for detaching the knockout portion from the main portion, the web being contiguous to both the knockout portion and the main portion;

re-coupling the knockout portion to the main portion by causing insertion of a member extending from the knockout portion or main portion into an aperture in the other portion.

19. The method of claim 18, wherein the at least one web of contiguous metal is broken when the knockout portion is detached from the main portion, and wherein the knockout portion is rotated from its original position when re-coupled to the main portion.

20. The method of claim 18, wherein the member includes a protrusion for creating a mechanical coupling with the main portion.

* * * * *